United States Patent
Richard et al.

[11] Patent Number: 5,592,087
[45] Date of Patent: Jan. 7, 1997

[54] LOW EDDY CURRENT RADIO FREQUENCY SHIELD FOR MAGNETIC RESONANCE IMAGING

[75] Inventors: Mark A. Richard, Cleveland Heights; Xueming Zou, Chesterland; Michael A. Morich, Mentor, all of Ohio

[73] Assignee: Picker International, Inc., Highland Heights, Ohio

[21] Appl. No.: 379,979

[22] Filed: Jan. 27, 1995

[51] Int. Cl.$^6$ .............................. G01H 3/00; G01H 3/14
[52] U.S. Cl. ..................... 324/318; 324/319; 324/322
[58] Field of Search .................................. 324/318, 319, 324/322

[56] References Cited

U.S. PATENT DOCUMENTS

| | | | |
|---|---|---|---|
| 4,642,569 | 2/1987 | Hayes et al. | 324/318 |
| 4,924,184 | 6/1990 | Yoda | 324/318 |
| 5,243,286 | 9/1993 | Rzedzian et al. | 324/318 |
| 5,349,297 | 9/1994 | DeMeester et al. | 324/318 |
| 5,396,173 | 3/1995 | Sakakura et al. | 324/318 |

*Primary Examiner*—Louis M. Arana
*Assistant Examiner*—Mack Haynes
*Attorney, Agent, or Firm*—Fay, Sharpe, Beall, Fagan, Minnich & McKee

[57] ABSTRACT

A magnetic resonance imaging apparatus includes a magnet assembly (10) for generating a temporally constant primary magnetic field through a central bore (14). The central bore is surrounded by a gradient coil assembly (30) including a dielectric former (32) and gradient coils (34, 36, 38) for generating magnetic field gradient pulses across the examination region. A radio frequency coil assembly (50) including a birdcage coil (52) is mounted inside of the gradient coil assembly and surrounding the examination region. A radio frequency shield (60) includes a dielectric sheet (62) having a plurality of first metal foil strips (72) defined on each surface. The metal strips are defined by etching or cutting gaps (70) in a continuous sheet of copper foil, leaving bridges (74) across the gaps adjacent opposite ends of the foil strips. The foil strips on opposite faces of the dielectric sheet are offset by half the width of one strip such that each strip is capacitively coupled to two strips on the opposite surface. The radio frequency coil induces radio or megahertz frequency eddy currents to which the capacitive coupling appears as a short-circuit, allowing the induced radio frequency currents to pass circumferentially around the shield. The gradient coil assembly induces kilohertz frequency eddy currents to which the capacitive couplings appear as open circuits. The kilohertz eddy currents flow longitudinally along a strip, cross a bridge adjacent one end of the strip, and flow back longitudinally along an adjacent strip, and so forth.

17 Claims, 4 Drawing Sheets

LOW EDDY CURRENT RADIO FREQUENCY SHIELD FOR MAGNETIC RESONANCE IMAGING

BACKGROUND OF THE INVENTION

The present application relates to the magnetic resonance art. It finds particular application in conjunction with cylindrical bore magnetic resonance imagers with annular magnets and will be described with particular reference thereto. However, it is to be appreciated that the present invention will also find application in conjunction with magnetic resonance spectroscopy systems and other types of magnetic resonance imagers.

Heretofore, magnetic resonance imaging systems have commonly included a series of annular superconducting magnets surrounded by a toroidal vacuum dewar. Gradient magnetic field coils were disposed circumferentially around a central bore of the vacuum dewar, often supported on a dielectric cylindrical former. A radio frequency coil was commonly disposed inside of the gradient coils, often on another cylindrical former.

In order to maximize the size of the central patient receiving bore, hence the size of the patient which could be received, it was desirable to mount the radio frequency coil on as large a diameter cylinder as possible. On the other hand, the cost of the superconducting main field magnets increased with size and diameter. Hence, it was desirable to make the main field magnets as small a diameter as possible. In magnetic resonance imaging, the gradient field coils were called upon to create magnetic field gradient pulses. The sharpness or crispness of the magnetic field gradient pulses was a limiting factor on the resolution and sharpness of the resultant image. The smaller the size, i.e., the smaller the diameter, of the gradient field coils, the sharper and more crisp the gradient field pulses tended to be due to increased efficiency and slew rate and reduced eddy current effects from interaction with cold shields. In order to accommodate these competing interests, the radio frequency and gradient magnetic field coils were typically mounted close together such that both had nearly the same diameter.

The gradient coils are pulsed by applying pulses of high amperage kilohertz frequency current. The high power pulses applied to the gradient coils created electrical noise which corrupted the signal received by the radio frequency coil. To protect the radio frequency coil from this noise, a metallic shield was typically located between the gradient coil and the radio frequency coil. In general, the thicker the layer of metal, the more effective the shielding. Often, the metallic shield was positioned either on an inside diameter of the dielectric former which carried the gradient field coils or was laminated to the exterior diameter of the dielectric former before the gradient coils were applied. See, for example, parent U.S. patent application Ser. No. 08/080,413 of Morich, DeMeester, Patrick, and Zou.

In order to meet clinically driven demands for faster higher resolution imaging, the gradient strength and slew rate have been increasing, i.e., the gradients are becoming larger and crisper. One difficulty encountered was that the large gradient pulses induced corresponding eddy currents in surrounding metal structures, such as the metallic shield. The eddy currents limited the slew rates.

One approach for limiting eddy currents was to cut the solid copper sheet into smaller elements to reduce the size of the material available to conduct eddy currents, hence reduce eddy currents. See, for example, U.S. Pat. No. 4,642,659 of Hayes and U.S. Pat. No. 5,243,286 of Rezedzian.

One approach for limiting eddy currents was to replace the solid copper sheets with a copper mesh. Because the mesh typically had less metal that the metal sheets, shielding was compromised. Another approach was to replace the solid copper sheets with strips of copper tape coated with an insulator. The tape extended longitudinally along the cylinder and adjacent tape strips were lapped to create a capacitive coupling. The effective capacitive coupling between the lapped copper tape strips provided an effective short circuit for radio frequency currents, e.g., in the megahertz range. However, the capacitive coupling appeared as an open circuit to low frequency components. One of the disadvantages of the lapped copper tape was that the low impedance path for RF currents was enhanced by very thin dielectric coatings on the strips. First, it was relatively difficult to obtain sufficiently thin dielectric coatings on the tape or strips. Second, thinning of the dielectric coating promoted arcing.

A further difficulty with the laminated tape strips and the segmented copper sheet was that they provided an effective closed path only for the radio frequency eddy current components. Kilohertz frequency induced currents tended to arc between the strips. The arcing caused noise spikes which again degraded the resultant images.

Although the use of copper strips and copper mesh limited eddy currents, the eddy current problems remained only on a reduced scale. As gradient strength and slew rates have continued to increase, it has been found that the copper strips and copper mesh still support deleterious eddy currents.

The present invention contemplates a new and improved radio frequency shield which overcomes the above-referenced problems and others.

SUMMARY OF THE INVENTION

In accordance with the present invention, a thin sheet of dielectric material is provided. A multiplicity of foil segments are disposed on each side of the dielectric sheet. The foil segments on opposite sides of the dielectric sheet are lapped sufficiently to provide a capacitive coupling across the dielectric sheet for high frequency components. Foil segments on each side of the dielectric sheet are interconnected by bridges such that a meandering low impedance interconnection path is defined.

In accordance with a more limited aspect of the present invention, the foil segments are strips on opposite sides of the dielectric sheet which are lapped about half way to provide the capacitive coupling.

In accordance with a more limited aspect of the present invention, the meandering low impedance path includes direct interconnections of the copper strips at alternating ends.

In accordance with another more limited aspect of the present invention, a direct low impedance path is provided between the foil segments on opposite sides of the dielectric sheet.

In accordance with a yet more limited aspect of the present invention, the radio frequency shield is disposed between a gradient coil and a birdcage type radio frequency coil. The birdcage type radio frequency coil has end rings therearound. The meandering path includes direct low impedance interconnections between alternating strips generally in alignment with the radio frequency coil end rings.

One advantage of the present invention is that it increases radio frequency shielding.

Another advantage of the present invention is that it reduces electrical arcing and the associated noise.

Another advantage of the present invention is that it minimizes gradient and kilohertz range eddy currents.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
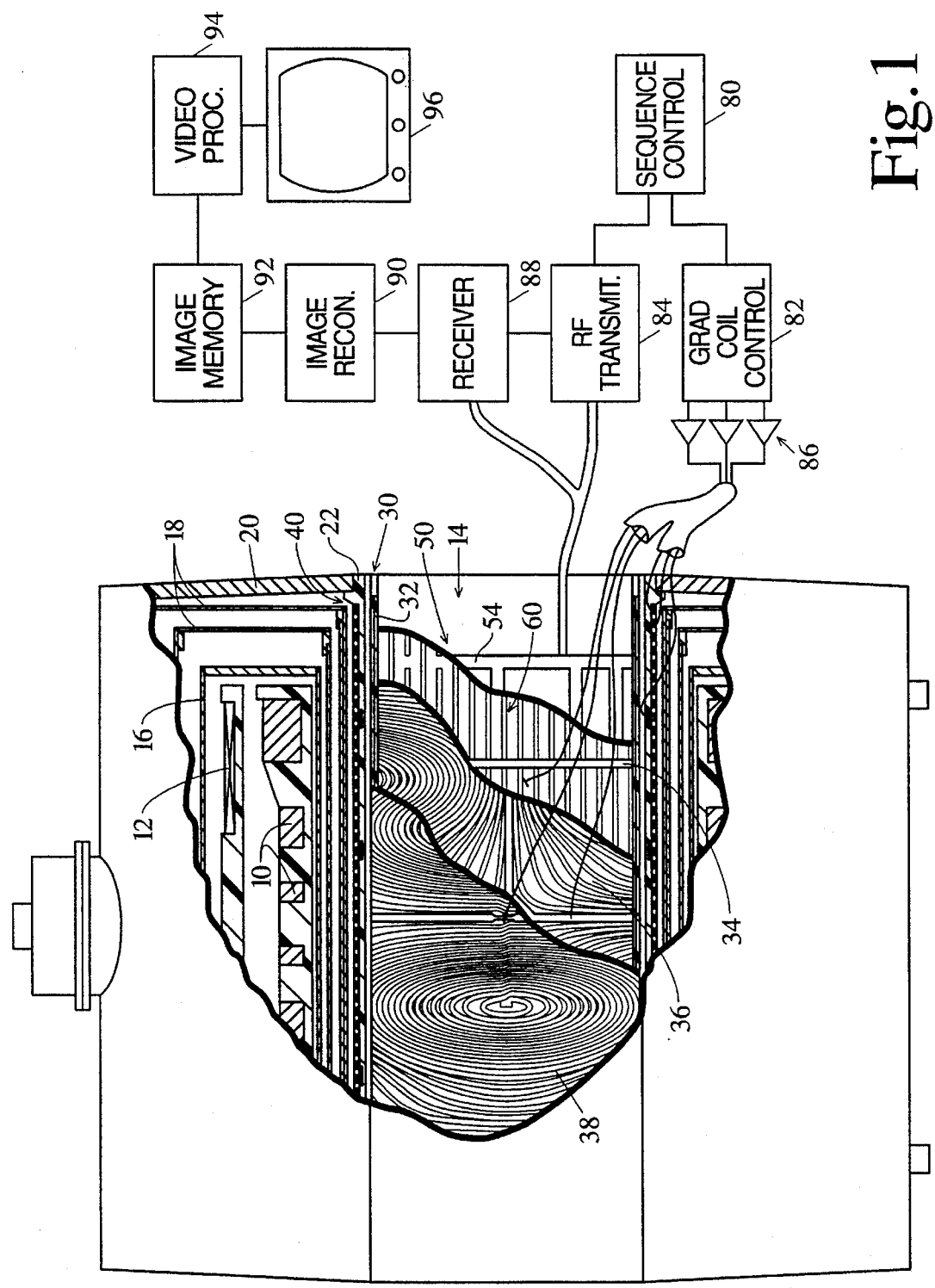
FIG. 1 is a diagrammatic illustration of a magnetic resonance imaging system in accordance with the present invention.

With reference to FIG. 1, a plurality of superconducting primary magnetic field coils 10 along with shield coils 12 generate a primary magnetic field extending along a longitudinal or z-axis of a central bore 14. The primary magnetic field is temporally constant and substantially uniform through an imaging region at the geometric center of the bore 14. The superconducting coils are held in a helium can 16 which chills the coils to their superconducting temperature. To reduce helium boil-off, the superconducting magnetic field coils and the helium can are surrounded by cold shields 18 and a vacuum dewar 20. The dewar 20 is a toroidal vacuum vessel which extends around the central bore 14. The vacuum vessel includes an inner cylindrical wall 22.

Figure 2:
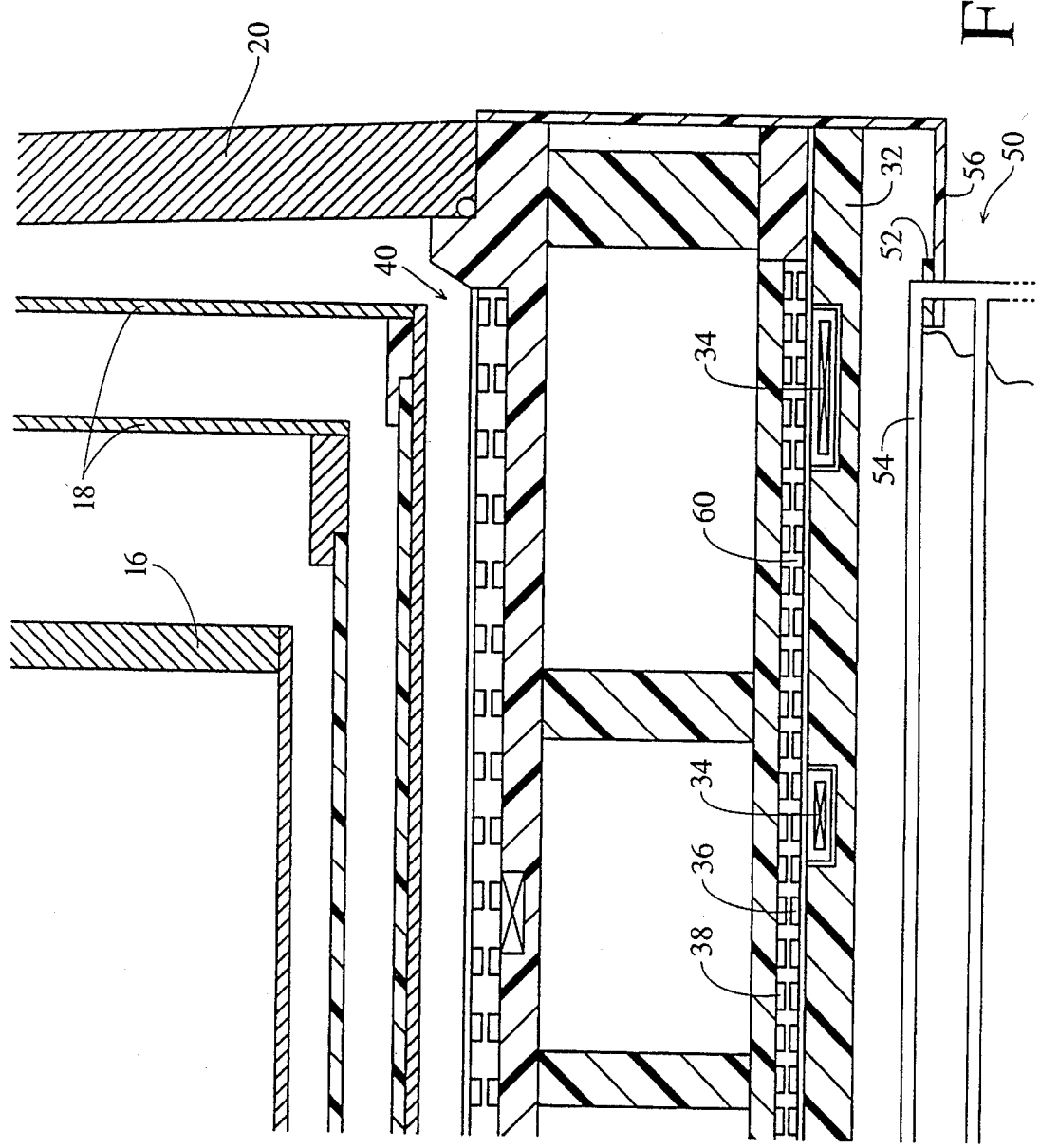
FIG. 2 is an enlarged cross-sectional view of the gradient and radio frequency coil assemblies of FIG. 1.

With continuing reference to FIG. 1 and further reference to FIG. 2, a primary gradient coil assembly 30 is mounted inside the inner wall 22 of the toroidal vacuum vessel. The gradient coil assembly includes a cylindrical former 32 of a dielectric material such as glass-reinforced epoxy. The z-gradient coils 34 are wrapped around the dielectric former 32. y-gradient coils 36 are wrapped around the z-gradient coils and x-gradient coils 38 are wrapped around the y-gradient coils. In the preferred embodiment, the x and y-gradient coils are thumbprint or distributed gradient coils, although bunched gradient coils can also be used. Preferably, the gradient coil assembly is a self-shielded gradient coil assembly. To this end, x, y, and z-gradient shield coils 40 surround the primary gradient coil assembly 30. The primary and shield gradient coils generate gradient magnetic fields such that the gradient fields of the two coils combine within the examination region to produce a linear gradient and cancel outside the central bore 14. In the preferred embodiment, the shield gradient coils are mounted on a surface of the toroidal vacuum vessel cylinder 22. Magnetic field shims, not shown, are inserted in the annular gap between the primary and shield gradient coils.

A radio frequency coil assembly 50 is mounted within the primary gradient coil assembly 30. More specifically to the preferred embodiment, the radio frequency coil assembly includes a dielectric former 52 on which a birdcage style coil 54 is mounted. A bore liner 56 is disposed inside the birdcage coil assembly and extends the length of the central bore to provide a cosmetic covering for the radio frequency and gradient coil assemblies.

Figure 3:
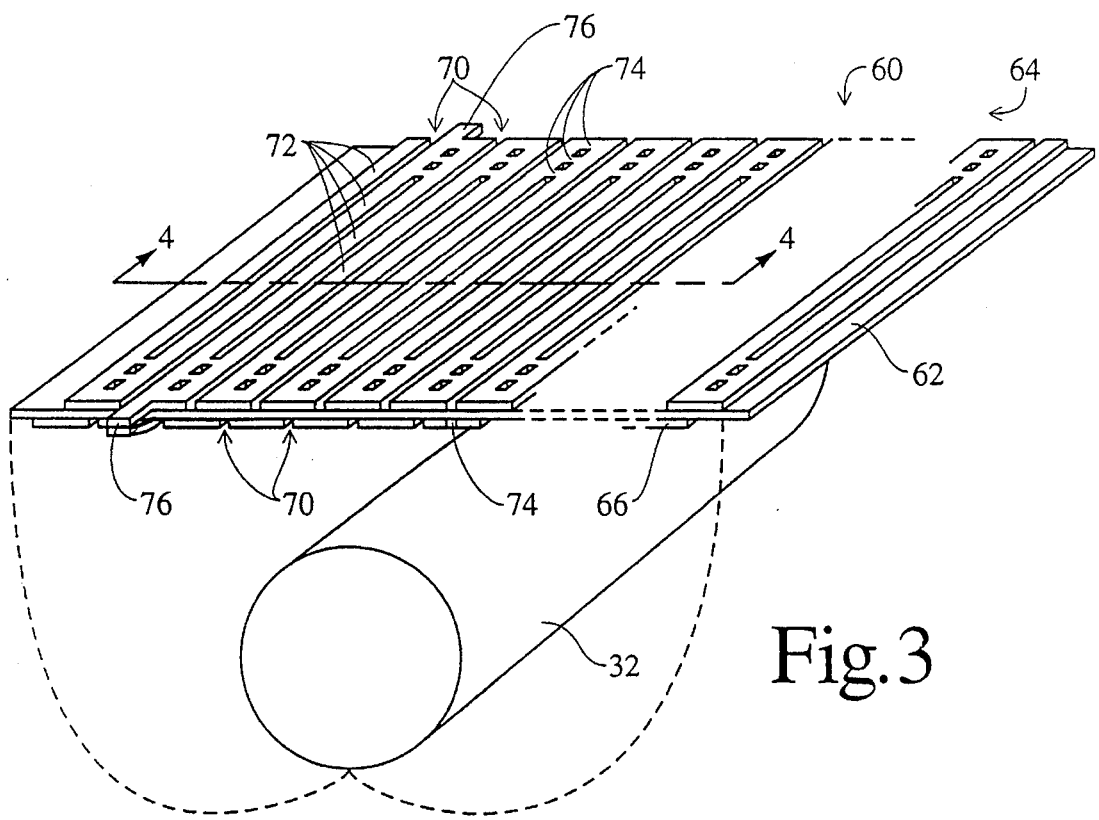
FIG. 3 is a diagrammatic illustration depicting an RF shield in accordance with the present invention in conjunction with a dielectric cylindrical former.

With continuing reference to FIGS. 1 and 2, and particular reference to FIG. 3, a radio frequency or RF coil shield 60 is disposed between the radio frequency coil assembly 50 and the primary gradient coils 34, 36, and 38. In the preferred embodiment, the radio frequency shield 60 is applied to an external surface of the cylindrical dielectric former 32 before the primary x, y, and z-gradient coils are applied. Alternately, the radio frequency shield is mounted to an inner surface of the dielectric former 32.

The radio frequency shield 60 in the preferred embodiment, is a double-sided circuit board which includes a central dielectric layer 62 which has layers of metal, preferably copper, foil 64, 66 adhered to opposite sides. The dielectric material is thin and flexible such that it can be wrapped easily around the dielectric cylinder. Teflon, fiber-reinforced epoxy, or the like, are suitable dielectric layers. The copper layers are etched or cut, in the preferred embodiment, to define a series of gaps 70 extending in a direction parallel to the longitudinal axis, leaving metal or copper strips 72 therebetween. Thin bridges 74 interconnected adjacent metal strips 72 at adjacent opposite ends thereof. In this manner, a meandering, generally S-shaped low impedance path is defined between adjacent strips. In the preferred embodiment, the copper layers are half ounce copper, the longitudinal strips are about 35 mm wide and are separated by gaps of about 0.175 mm. Three low impedance bridges, each about 1 cm wide, connect the strips at alternating ends. The bridges may be etched to a reduced height.

Figure 4:
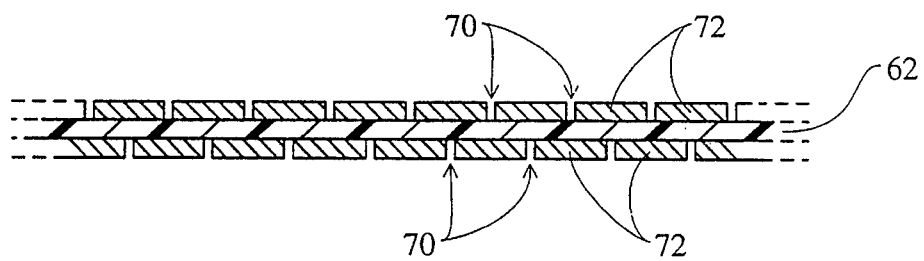
FIG. 4 is a cross-sectional view of the RF shield of FIG. 3 through section 4—4; and, FIG. 5 illustrates an alternate embodiment of the present invention in which the meandering low impedance connection path is generally aligned with the end rings of a birdcage RF coil.

With continuing reference to FIG. 3 and further reference to FIG. 4, analogous metallic strips with interconnecting low impedance bridges are provided on both surfaces of the dielectric layer 62. However, the strips are offset such that each strip on one side of the dielectric layer overlaps a pair of adjoining strips on the opposite side of the dielectric layer. In the illustrated embodiment, the overlap is about 17.5 mm. Four tabs 76 provide low impedance paths between the electrical conductors on opposite sides of the dielectric layer. The tabs are arranged with quadrature symmetry, i.e., if such tabs are introduced at each end and at equidistant points around the circumference. The tabs also make convenient attachment points for ground connections. The length of the dielectric sheet is selected such that it extends circumferentially around the dielectric former 32 with the end metallic strips lapping analogous to the previously described metallic strips. Preferably at least 32 strips are provided on each surface circumferentially around the dielectric cylinder 32, the preferred embodiment having about 64 strips. The low impedance path between the conductive strips on opposite sides prevents arcing across the dielectric sheet 62. This is particularly important due to the short path length at the edges of the sheets.

The lapped metallic strips on opposite faces and the dielectric sheet itself provide capacitive interconnections between the two sides of the shield. Radio frequency currents induced in the shield flow in an azimuthal or circumferential direction around the shield through the capacitors formed by the overlapping strips and the dielectric layer in between. Capacitance, neglecting fringing effects, is defined by:

$$C = \epsilon \frac{A}{d},\qquad(1)$$

where $\epsilon$ is the permittivity of the dielectric, A is the area of the dielectric between the lapped strips, and d is the dielectric thickness. Thus, to maximize current flow within the shield, the capacitance is maximized by using a dielectric which is very thin and has a high permittivity relative to the permittivity of air. The narrow gap between two adjacent strips also provides some capacitive coupling, with $\epsilon$ being the permittivity of air or epoxy potting medium when integrated with the gradient coil assembly, A being the area of the etched side of each strip, and d being the width of the spacing between strips. In this manner, limited high frequency current flow is provided from strip to strip in the azimuthal direction on each side independently of the others.

Audio frequency, particularly gradient, eddy currents are prevented from flowing in the azimuthal direction by this capacitance. The impedance presented by these capacitive couplings is inversely proportional to frequency. Thus, audio or kilohertz frequency gradient eddy currents are blocked while radio, particularly megahertz frequency eddy currents are not. The bridges connecting the longitudinal strips are disposed adjacent opposite ends only so that complete rings are not formed. Hence, the bridges do not contribute to eddy currents by providing direct circumferential low frequency flow paths. At each end, only every second pair of strips is shorted. Only minimal low frequency eddy currents are generated in the longitudinal direction and any that do flow would tend to create predominantly a $B_x$ or $B_y$ field (hence, the RF shielding effect). Accordingly, the continuous longitudinal path is not of particular concern for gradient pulsing but provides good RF screening.

Arcing between individual strips on each side of the shield is eliminated by the presence of the bridges. The bridges prevent high voltage levels from building up between adjacent copper strips. Arcing between the two sides of the shield through or around the dielectric layer is prevented by shorting the two sides of the shield together at the four symmetric points 76. The four points 76 are chosen to maintain quadrature symmetry.

Figure 5:
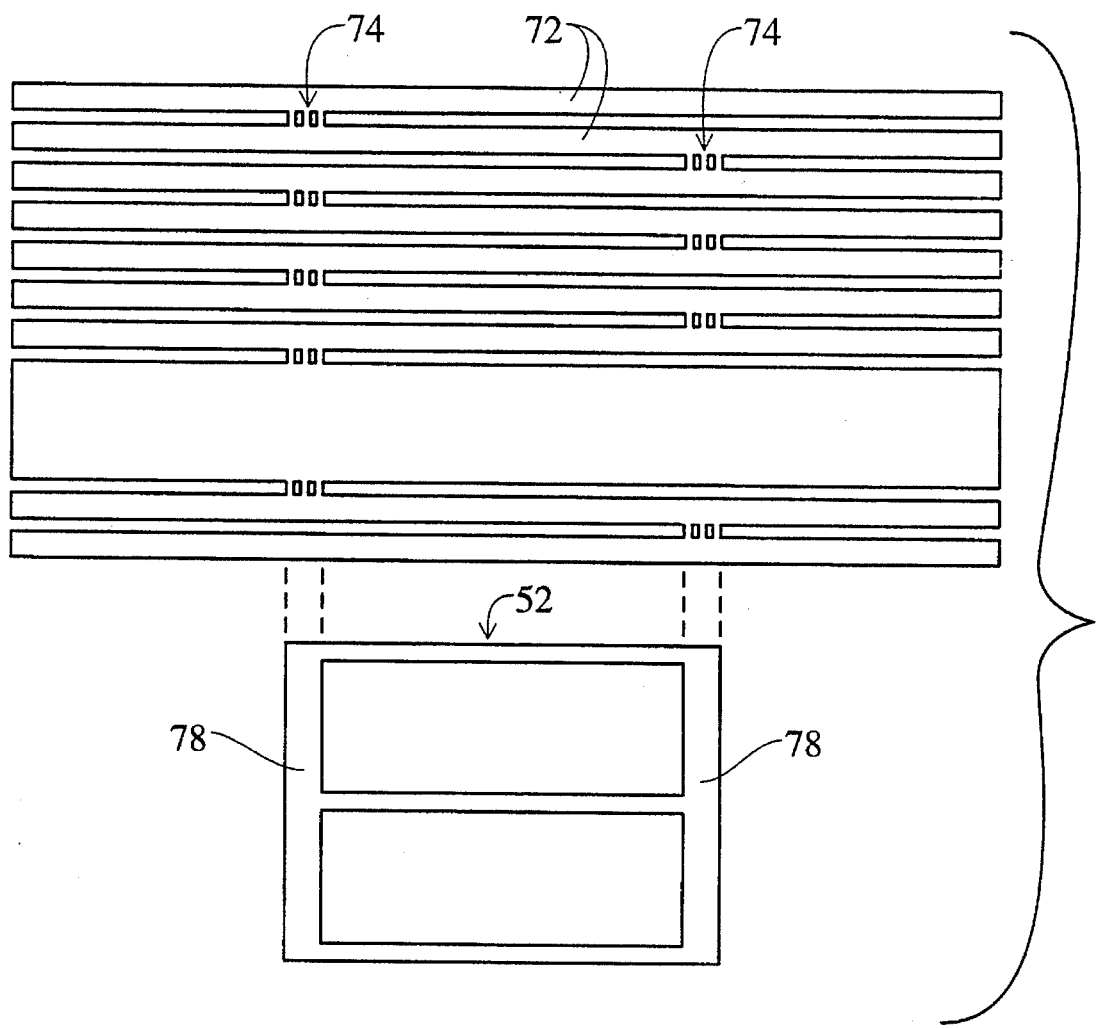

With reference to FIG. 5, various alternate etching paths may be provided and various other dielectric materials may be used. Although the fiber reinforced epoxy is used in the preferred embodiment, Teflon, a more expensive material, has a lower permittivity and has a low dielectric loss tangent. Accordingly, the Q-factor of the RF coil that is placed within the shield is not damped as much with Teflon as with the fiber-reinforced epoxy shield. Those skilled in the art will appreciate that there are a plethora of other dielectrics which may be used in the construction of the shield.

In the embodiment of FIG. 5, the bridges 74 are positioned a short distance from each end of the cylinder. The bridges are substantially in longitudinal alignment with end rings 78 of the birdcage coil 52. In yet another variation, different numbers of bridges may be provided such as 1, 2, 4, or the like between longitudinal strips.

With reference again to FIG. 1, a sequence control processor 80 accesses a memory to load one of a plurality of predefined magnetic resonance imaging sequences. The sequence control processor 80 controls a gradient current control 82 and a transmitter 84 to cause the formation of radio frequency and gradient pulses in accordance with the loaded magnetic resonance sequence. The gradient coil controller 82 is connected with a series of current pulse amplifiers 86 which, in turn, supply current pulses to the appropriate primary gradient coils 34, 36, and 38 and shield gradient coils. The transmitter 84, preferably a digital transmitter, is connected with the radio frequency coil 52 for generating radio frequency pulses for exciting and manipulating magnetic resonance in selected dipoles of a portion of a subject within the examination region. A radio frequency receiver 88, preferably a digital receiver, is connected with the radio frequency coil or surface coils (not shown) for demodulating magnetic resonance signals emanating from the examined portion of the subject. An image reconstruction processor 90 reconstructs the received resonance signals into an electronic image representation using conventional reconstruction algorithms such as an inverse two-dimensional Fourier transform reconstruction. The image representations are stored in an image memory 92. An image processor 94 converts selected portions of the electronic images stored in the image memory 92 into appropriate format for display on a video, LCD, active matrix, or other monitor 94.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus which includes a toroidal magnet assembly for generating a temporally constant magnetic field through an examination region in a bore thereof, a cylindrical gradient coil assembly mounted in the bore for causing magnetic field gradients within the examination region, a cylindrical radio frequency coil assembly disposed within the cylindrical gradient coil assembly for transmitting radio frequency pulses into the examination region, and a radio frequency shield disposed between the cylindrical gradient coil assembly and the cylindrical radio frequency coil assembly, the radio frequency shield including:

a dielectric layer;

a plurality of first metal strips mounted on one surface of the dielectric layer extending substantially parallel to a longitudinal axis of the bore, the first metal strips being separated by gaps;

a plurality of second metal strips disposed on an opposite face of the dielectric layer and extending substantially parallel to the longitudinal axis of the bore, the second metal strips being separated by gaps, the first and second metal strips being offset from each other such that the gaps between the first metal strips are substantially centered over the second metal strips;

a plurality of low impedance direct current bridges connecting adjacent first metal strips and adjacent second metal strips, the bridges connecting adjacent pairs of metal strips being staggered such that the first metal strips and the staggered bridges form a meandering low impedance direct current path and the second metal strips and the staggered bridges form another meandering low impedance direct current path such that any low frequency and direct currents are constrained to flow along the meandering low impedance paths.

2. The magnetic resonance imaging apparatus as set forth in claim 1 further including:

a plurality of low impedance connections between the plurality of first metal strips and the plurality of second metal strips.

3. The magnetic resonance imaging apparatus as set forth in claim 2 further including:

the plurality of low impedance connections between the plurality of first metal strips and the plurality of second metal strips being arranged with quadrature symmetry.

4. A magnetic resonance imaging apparatus which includes a toroidal magnet assembly to generate a temporally constant magnetic field through an examination region in a bore thereof, a cylindrical gradient coil assembly mounted in the bore to cause magnetic field gradients within the examination region, a cylindrical radio frequency coil assembly disposed within the cylindrical gradient coil assembly to transmit radio frequency pulses into the examination region, and a radio frequency shield disposed between the cylindrical gradient coil assembly and the cylindrical radio frequency coil assembly, the radio frequency shield including:

a dielectric layer;

a plurality of first metal strips mounted on one surface of the dielectric layer extending substantially parallel to a longitudinal axis of the bore, the first metal strips being separated by gaps;

a plurality of second metal strips disposed on an opposite face of the dielectric layer and extending substantially parallel to the longitudinal axis of the bore, the second metal strips being separated by gaps, the first and second metal strips being offset from each other such that the gaps between the first metal strips are substantially centered over the second metal strips;

a plurality of low impedance bridges connecting one end of adjacent pairs of first metal strips and one end of adjacent pairs of second metal strips, the bridges being disposed alternately adjacent opposite ends of the adjacent pairs of the first metal strips such that the first metal strips and the alternately disposed bridges form a meandering low impedance path and the bridges being disposed alternately adjacent opposite ends of the adjacent pairs of the second metal strips to form another meandering low impedance path, the bridges being shorter than the first and second metal strips such that any low frequency and direct currents are constrained to flow primarily parallel to the longitudinal axis along the first and second metal strips with only a minimal circumferential current flow along the bridges.

5. The magnetic resonance imaging apparatus as set forth in claim 1 wherein:

the radio frequency coil is a birdcage style coil having a pair of end rings extending circumferentially around the bore adjacent the radio frequency shield and the bridges being disposed generally in alignment with the birdcage style radio frequency coil end rings.

6. The magnetic resonance imaging apparatus as set forth in claim 1 wherein:

the gaps between the pluralities of first and second metal strips are defined by removing material from first and second continuous foil sheets and wherein the bridges are defined by interrupting the material removal.

7. The magnetic resonance imaging apparatus as set forth in claim 4 wherein the bridges include capacitive elements.

8. A magnetic resonance imaging apparatus comprising:

a magnet assembly for generating a temporally constant magnetic field longitudinally through an examination region disposed in a central longitudinal bore thereof;

a gradient coil assembly including gradient coils for generating magnetic field gradients along three mutually orthogonal axes within the examination region, the gradient coil assembly being disposed around the examination region;

a radio frequency coil assembly including a radio frequency coil disposed around the examination region and adjacent the gradient coil assembly;

a radio frequency shield disposed between the gradient coils and the radio frequency coil, the radio frequency shield including:

a dielectric layer having first and second faces and extending circumferentially around the examination region, a plurality of first metal strips disposed on the first face of the dielectric layer extending parallel to a longitudinal axis of the bore, a plurality of second metal strips disposed on the second face of the dielectric layer extending parallel to the longitudinal axis, the second metal strips being offset circumferentially relative to the first metal strips such that each of the first metal strips is capacitively coupled to two of the second metal strips and each of the second metal strips is capacitively coupled to two of the first metal strips, and low impedance, direct current interconnections interconnecting each of the metal strips with adjacent metal strips, the low impedance, direct current interconnections being longitudinally offset to prevent low frequency and direct currents from flowing in a loop circumferentially around the radio frequency shield.

9. The magnetic resonance imaging apparatus as set forth in claim 8 further including:

a plurality of low impedance connections connecting the plurality of first metal strips with the plurality of second metal strips.

10. The magnetic resonance imaging apparatus as set forth in claim 9 wherein the low impedance connections between the first and second metal strips are arranged with quadrature symmetry.

11. The magnetic resonance imaging apparatus as set forth in claim 8 wherein the low impedance connections are disposed alternately adjacent opposite ends of the longitudinal strips such that low frequency and direct currents are constrained to flow in a zig-zag path.

12. The magnetic resonance imaging apparatus as set forth in claim 8 wherein:

the radio frequency coil is a birdcage style coil having a pair of end rings extending circumferentially around the bore adjacent the radio frequency shield and the low impedance connections are disposed generally in alignment with the birdcage style radio frequency coil end rings.

13. The magnetic resonance imaging apparatus as set forth in claim 8 wherein the gaps between the first and second metal strips are defined by removing metal foil from first and second continuous foil sheets and wherein the low impedance connections are defined by interrupting the metal foil removal.

14. The magnetic resonance imaging apparatus as set forth in claim 8 wherein the gradient coil assembly includes a dielectric former, the radio frequency shield being mounted around an exterior surface of the dielectric former and the gradient coils being mounted around the radio frequency shield.

15. A radio frequency shield for a magnetic resonance imaging apparatus which includes a toroidal magnet assembly for generating a temporally constant magnetic field through an examination region in a bore thereof, a cylindrical gradient coil assembly mounted in the bore for causing magnetic field gradients within the examination region, a cylindrical radio frequency coil assembly disposed within the cylindrical gradient coil assembly for transmitting radio frequency pulses into the examination region, the radio frequency shield being disposed between the cylindrical gradient coil assembly and the cylindrical radio frequency coil assembly and including:

a dielectric layer;

a plurality of first metal strips mounted on one surface of the dielectric layer extending substantially parallel to a longitudinal axis of the bore, the first metal strips being separated by gaps;

a plurality of second metal strips disposed on an opposite face of the dielectric layer and extending substantially parallel to the longitudinal axis of the bore, the second metal strips being separated by gaps, the first and second metal strips being offset from each other such that the gaps between the first metal strips are substantially centered over the second metal strips;

a plurality of low impedance bridges connecting adjacent pairs of the first metal strips and connecting adjacent pairs of the second metal strips, the bridges connecting the pairs of first metal strips being staggered such that the first metal strips and and the bridges form a first meandering low impedance path and the second metal strips and the staggered bridges form a second meandering low impedance path for low frequency and direct currents.

16. In a method of magnetic resonance imaging with a magnetic resonance apparatus that includes a primary magnet assembly for generating a temporally constant magnetic field through an examination region in a bore thereof, a gradient coil assembly mounted in the bore for causing magnetic field gradients within the examination region, a radio frequency coil assembly disposed within the gradient coil assembly for transmitting radio frequency pulses into the examination region, and a radio frequency shield disposed between the gradient coil assembly and the radio frequency coil assembly, which method includes generating the temporally constant magnetic field longitudinally through the examination region, inducing magnetic field gradient pulses across the examination region with the gradient coil assembly, and applying radio frequency pulses to the examination region with the radio frequency coil assembly, the improvement comprising:

passing radio frequency eddy currents induced in the radio frequency shield by the radio frequency coil assembly circumferentially around the shield while blocking gradient coil frequency and direct current eddy currents induced by the gradient coil assembly from passing circumferentially around the radio frequency shield and permitting the gradient coil frequency and direct current eddy currents induced in the radio frequency shield to travel along meandering paths having primarily longitudinal components with minimal circumferential components.

17. The method as set forth in claim 16 wherein the radio frequency shield includes a plurality of longitudinally extending strips having low impedance direct current bridges interconnecting adjacent strips near opposite ends thereof wherein:

the induced gradient frequency eddy currents flow longitudinally along one strip, cross bridge to an adjacent strip, flow longitudinally along the adjacent strip, cross the low impedance direct current bridge to a next adjacent strip, flow longitudinally across the next adjacent strip, and the like until the gradient frequency eddy currents die out.

* * * * *